United States Patent
Yamada et al.

(10) Patent No.: US 9,842,824 B2
(45) Date of Patent: Dec. 12, 2017

(54) COMPONENT MOUNTING APPARATUS

(71) Applicant: Panasonic Intellectual Property Management Co., Ltd., Osaka (JP)

(72) Inventors: Akira Yamada, Yamanashi (JP); Toshihiko Tsujikawa, Yamanashi (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 307 days.

(21) Appl. No.: 14/858,478

(22) Filed: Sep. 18, 2015

(65) Prior Publication Data

US 2016/0143154 A1 May 19, 2016

(30) Foreign Application Priority Data

Nov. 14, 2014 (JP) .................. 2014-231838

(51) Int. Cl.
    *H01L 23/00* (2006.01)
    *H05K 3/30* (2006.01)
    *H01L 21/67* (2006.01)

(52) U.S. Cl.
CPC ........ *H01L 24/75* (2013.01); *H01L 21/67144* (2013.01); *H01L 24/29* (2013.01); *H01L 24/83* (2013.01); *H01L 2224/2919* (2013.01); *H01L 2224/32225* (2013.01); *H01L 2224/7526* (2013.01); *H01L 2224/7592* (2013.01); *H01L 2224/75251* (2013.01);
(Continued)

(58) Field of Classification Search
CPC ... H05K 3/305; H01L 21/67144; H01L 24/29; H01L 24/75; H01L 24/83; H01L 2224/7526; H01L 2224/7592; H01L 2224/2919; H01L 2224/32225; H01L 2224/75251; H01L 2224/75252; H01L 2224/75253

See application file for complete search history.

(56) References Cited

U.S. PATENT DOCUMENTS

| | | | |
|---|---|---|---|
| 6,486,499 B1 * | 11/2002 | Krames | ............... H01L 33/38 257/103 |
| 7,580,103 B2 * | 8/2009 | Kawaguchi | ....... G02F 1/133308 349/110 |

(Continued)

FOREIGN PATENT DOCUMENTS

JP      5-206210 A      8/1993

*Primary Examiner* — Carl Arbes
(74) *Attorney, Agent, or Firm* — Pearne & Gordon LLP

(57) ABSTRACT

A component mounting apparatus crimps a component to a transparent substrate. The component is mounted on the transparent substrate through a photo-modifiable resin portion. The component mounting apparatus includes a receiving portion that receives a surface of the substrate by an upper surface of a transparent member, a pressing portion that presses the component against the substrate, an emission portion that emits light to the photo-modifiable resin portion through the transparent member, and a control portion that controls a timing when the pressing portion starts pressing of the component and a timing when the emission portion starts emission of the light so that the emission of the light is started a predetermined differential time earlier or later than the start of the pressing of the component.

5 Claims, 9 Drawing Sheets

(52) U.S. Cl.
CPC ............... *H01L 2224/75252* (2013.01); *H01L 2224/75253* (2013.01); *H01L 2224/83874* (2013.01); *H05K 3/305* (2013.01)

(56)     References Cited

U.S. PATENT DOCUMENTS

| | | | | |
|---|---|---|---|---|
| 8,008,676 | B2* | 8/2011 | Negley | H01L 33/54 257/100 |
| 9,252,373 | B2* | 2/2016 | Tischler | H01L 23/4985 |
| 2004/0012958 | A1* | 1/2004 | Hashimoto | H01L 33/38 362/241 |
| 2007/0097684 | A1* | 5/2007 | Obara | F21V 7/0083 362/249.01 |
| 2007/0145895 | A1* | 6/2007 | Yamamoto | H01L 51/5259 313/512 |
| 2011/0101399 | A1* | 5/2011 | Suehiro | H01L 33/56 257/98 |
| 2011/0104834 | A1* | 5/2011 | Suehiro | H01L 24/97 438/27 |
| 2011/0114989 | A1* | 5/2011 | Suehiro | H01L 33/54 257/99 |
| 2011/0193105 | A1* | 8/2011 | Lerman | H01L 25/0753 257/88 |
| 2012/0217496 | A1* | 8/2012 | Tischler | H01L 23/4985 257/43 |
| 2015/0028328 | A1* | 1/2015 | Ikeda | H01L 27/1218 257/43 |
| 2015/0236214 | A1* | 8/2015 | Tischler | H01L 23/5387 257/98 |

* cited by examiner

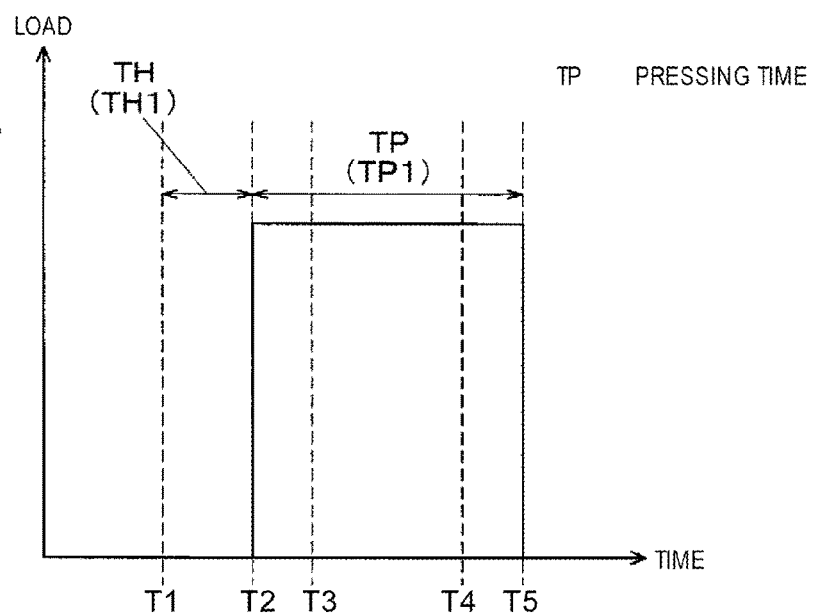
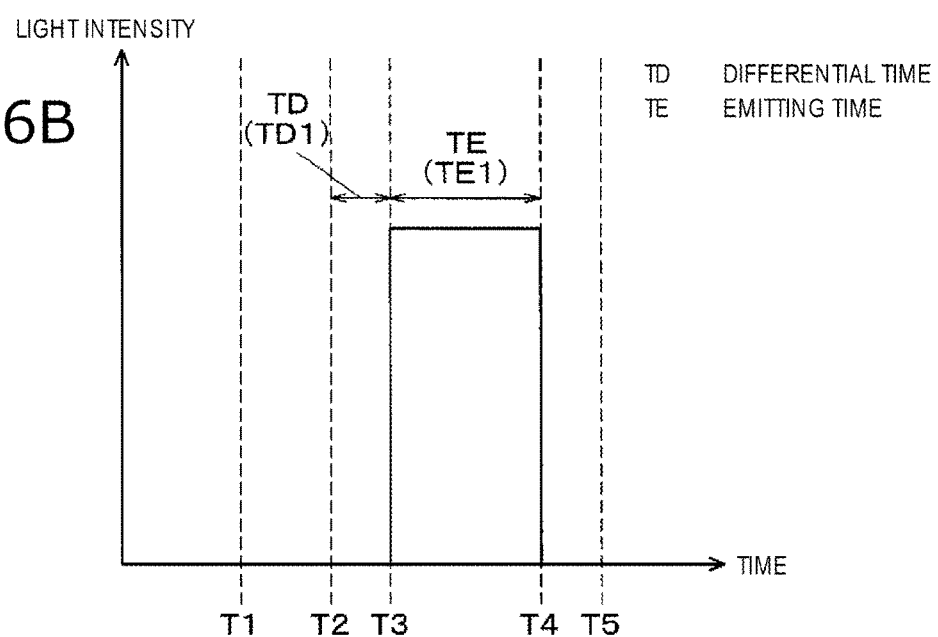

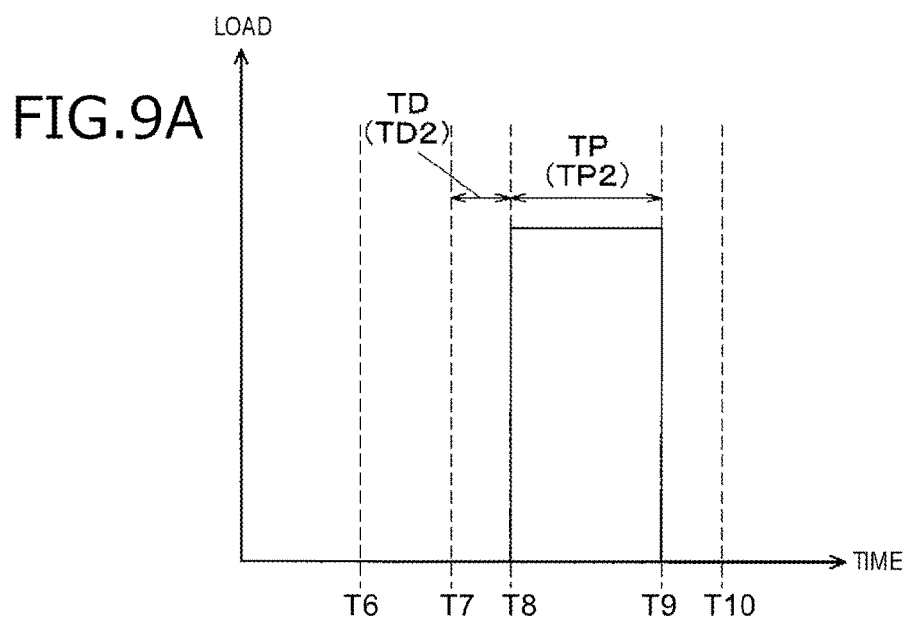
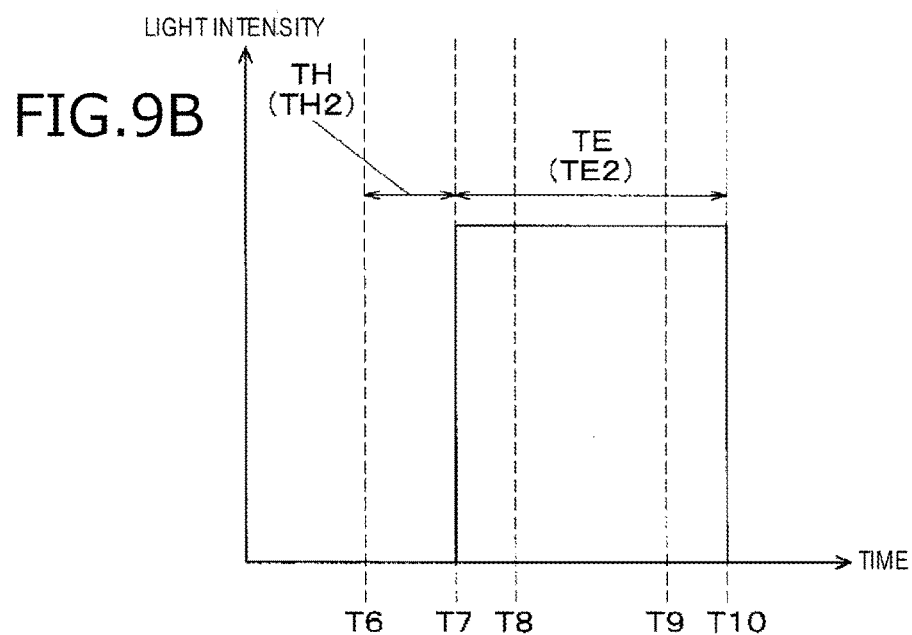

COMPONENT MOUNTING APPARATUS

CROSS REFERENCE TO RELATED APPLICATION

This application is based on Japanese Patent Application (No. 2014-231838) filed on Nov. 14, 2014, the contents of which are incorporated herein by reference.

BACKGROUND

1. Technical Field

The present invention relates to a component mounting apparatus which crimps components to a transparent substrate on which the components have been placed with interposition of a photo-modifiable resin therebetween.

2. Description of the Related Art

In the related art, there has been known a component mounting apparatus which crimps components such as ICs on a substrate with interposition of a photo-curable resin therebetween (e.g. JP-A-5-206210). The substrate is made of a transparent material such as glass. The photo-curable resin is one kind of photo-modifiable resin whose physical properties are changed when the resin absorbs light. Such a component mounting apparatus includes a receiving portion, a pressing portion, a light emission portion, and heaters. The receiving portion receives the substrate located under the components from below. The pressing portion presses the components against the substrate received from below by the receiving portion. The light emission portion emits light to the photo-curable resin to thereby cure the photo-curable resin. The heaters heat the receiving portion and the pressing portion respectively.

For crimping the components, the components are pressed against the substrate by the pressing portion in a state that the receiving portion and the pressing portion are heated, while light is emitted from the light emission portion to the photo-curable resin. In this manner, the photo-curable resin softened by heat is cured by the light to fix the components to the substrate simultaneously when electrodes of the components are crimped and bonded to electrodes of the substrate.

However, the background-art technique including Patent Literature 1 has the following problem because pressing the components and irradiating the components with light are started concurrently. That is, due to characteristics of the photo-curable resin which is used, curing of the photo-curable resin may be advanced by the light before the photo-curable resin is sufficiently softened by heat. Thus, there is a problem that the cured photo-curable resin may remain between the electrodes of the substrate and the electrodes of the components so that the electrodes of the substrate and the electrodes of the components cannot be bonded to each other to thereby cause occurrence of mounting failure. In addition, the photo-curable resin may be cured before the photo-curable resin is formed into a shape for fixing each component. Thus, there is a problem that the components cannot be fixed to the substrate with sufficient strength to thereby cause occurrence of mounting failure.

SUMMARY

To solve the foregoing problems, an object of the invention is to provide a component mounting apparatus which can suppress mounting failure from occurring due to insufficient bonding strength or insufficient fixation strength.

The component mounting apparatus according to the invention is a component mounting apparatus for crimping a component to a transparent substrate on which the component is mounted through a photo-modifiable resin portion therebetween, the apparatus including: a receiving portion that includes a transparent member and receives a surface of the substrate located under the component by an upper surface of the transparent member from below; a pressing portion that presses the component against the substrate received from below by the receiving portion; an emission portion that emits light to the photo-modifiable resin portion through the transparent member; and a control portion that controls a timing when the pressing portion starts pressing of the component and a timing when the emission portion starts emission of the light; wherein the control portion controls the pressing portion and the emission portion so as to start the emission of the light a predetermined differential time earlier or later than the start of the pressing of the component in a state that the substrate is received from below by the receiving portion.

According to the invention, it is possible to suppress mounting failure from occurring due to insufficient bonding strength or insufficient fixation strength.

BRIEF DESCRIPTION OF THE DRAWINGS

FIGS. 6A and 6B are graphs showing timings for pressing of components and emission of light beams performed by the component mounting apparatus according to the embodiment of the invention.

FIGS. 9A and 9B are graphs showing timings for pressing of components and emission of light beams in another component mounting method performed by the component mounting apparatus according to the embodiment of the invention.

DETAILED DESCRIPTION OF THE EXEMPLARY EMBODIMENTS

Figure 1:
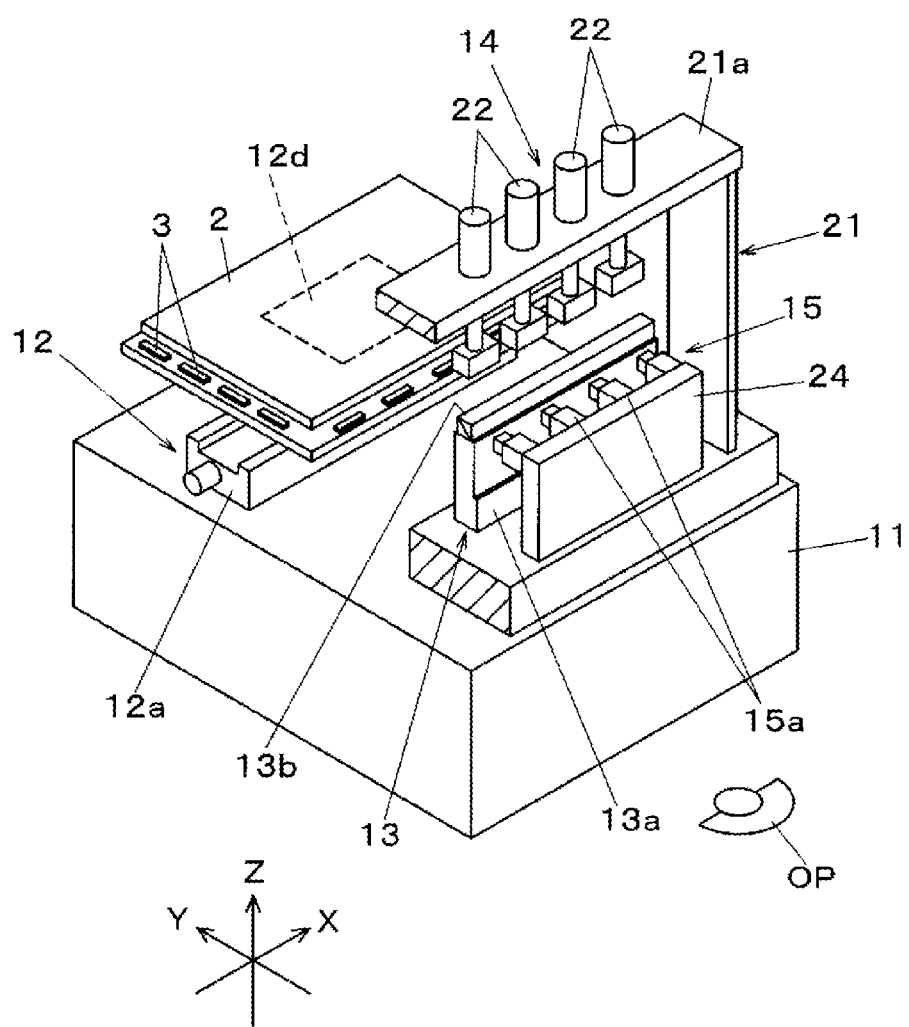
FIG. 1 is a perspective view of a component mounting apparatus according to an embodiment of the invention.

An embodiment of the invention will be described below in detail with reference to the drawings. Configuration, shape, etc. which will be described below will be simply exemplified for description and any change can be made thereon suitably in accordance with specifications of a component mounting apparatus. Corresponding elements in all the drawings will be referred to by the same numerals respectively and duplicate description thereof will be omitted. In FIG. 1 and parts of other drawings which will be described later, a left/right direction seen from an operator OP will be designated as X-axis direction, a front/rear direction seen from the operator OP will be designated as Y-axis direction, and an up/down direction seen from the operator OP will be designated as Z-axis direction.

Figure 2:
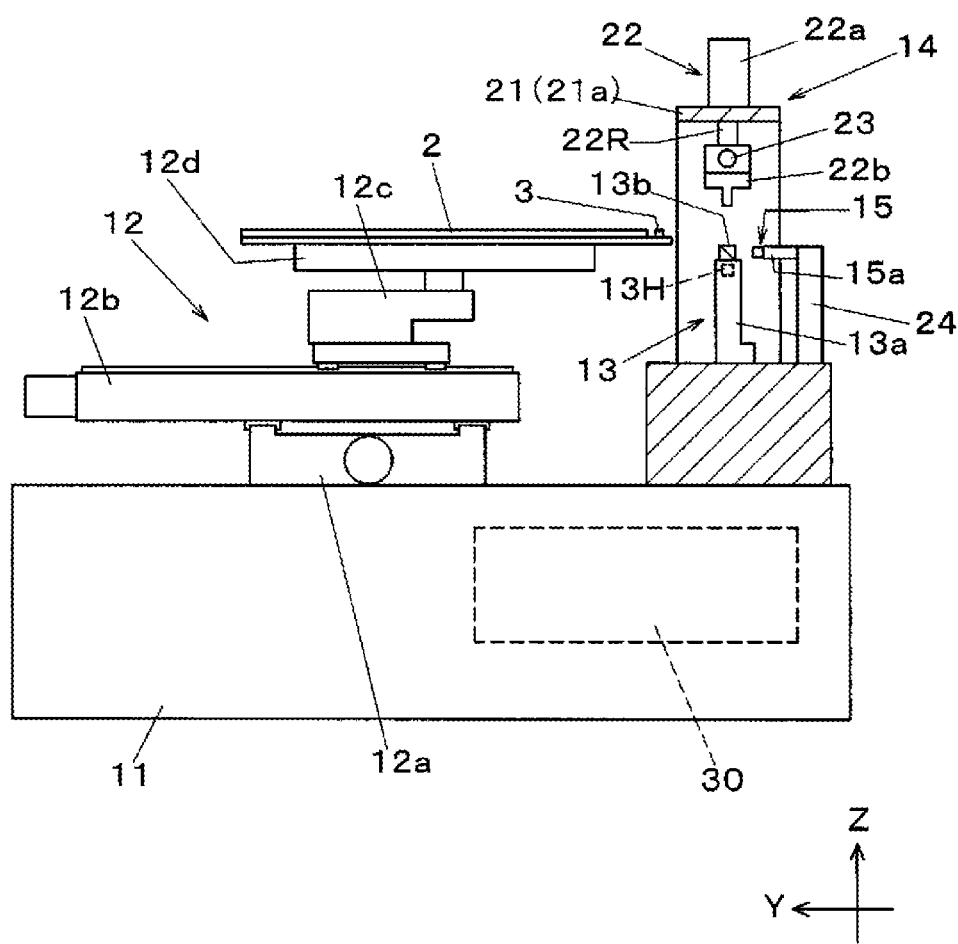
FIG. 2 is a side view of the component mounting apparatus according to the embodiment of the invention.

FIG. 1 and FIG. 2 show a component mounting apparatus 1 in an embodiment of the invention. The component mounting apparatus 1 is an apparatus which crimps components 3 such as ICs to an edge portion of a rectangular transparent substrate 2. The component mounting apparatus 1 is used in a completely crimping step etc. in a liquid crystal panel manufacturing apparatus.

Figure 3:
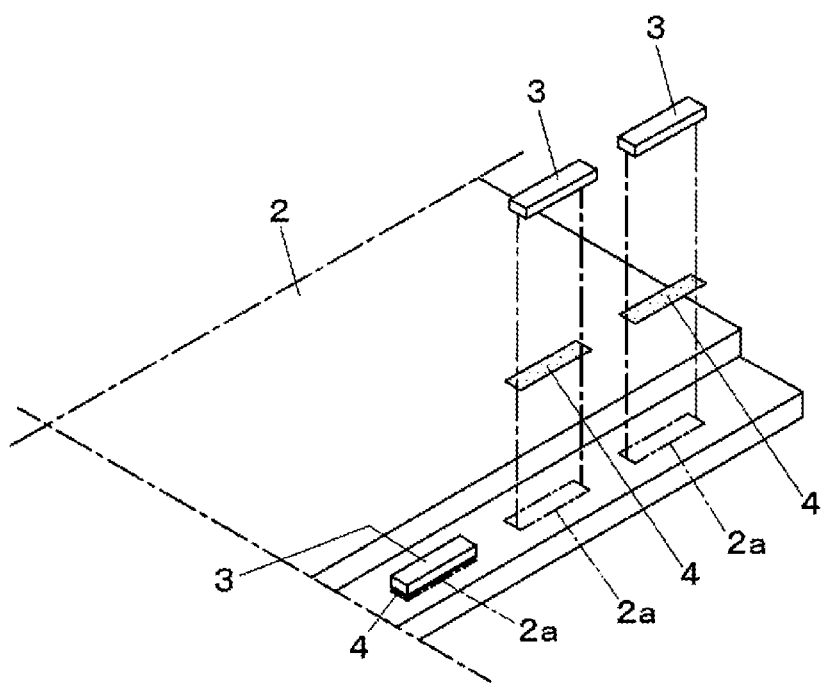
FIG. 3 is a partial perspective view of a substrate to which components are crimped by the component mounting apparatus according to the embodiment of the invention.

The substrate 2 is made of a transparent material such as glass. A plurality of component placement positions 2a (FIG. 3) are set at positions along, of the four sides of the substrate 2, two side edges which are not opposite but perpendicular to each other. Components 3 are placed (temporarily crimped) one by one on the component placement positions 2a respectively with the interposition of a photo-curable resin 4 therebetween. The photo-curable resin 4 is one kind of photo-modifiable resin whose physical properties are changed when the resin absorbs light. Assume here that the photo-curable resin 4 is an ultraviolet-curable resin which is cured when the resin is irradiated with ultraviolet rays.

In FIG. 1 and FIG. 2, the component mounting apparatus 1 includes an XYθ table mechanism 12, a receiving portion 13, a crimping operation portion 14, and a light emission portion 15 which are provided on a platform 11. The XYθ table mechanism 12 is constituted by an X-axis table 12a, a Y-axis table 12b, a θ table 12c and a substrate supporting table 12d which are stacked on one another. The X-axis table 12a is provided on the platform 11 and extends in the X-axis direction. The Y-axis table 12b is provided on the X-axis table 12a and extends in the Y-axis direction. The θ table 12c is provided on the Y-axis table 12b. The substrate supporting table 12d is supported by the θ table 12c.

The XYθ table mechanism 12 drives the X-axis table 12a to move the Y-axis table 12b (relative to the X-axis table 12a) in the X-axis direction. The XYθ table mechanism 12 drives the Y-axis table 12b to move the θ table 12c (relative to the Y-axis table 12b) in the Y-axis direction. The XYθ table mechanism 12 drives the θ table 12c to rotate the substrate supporting table 12d (relative to the θ table 12c) around a vertical axis (which is assumed as the Z-axis direction). That is, the XYθ table mechanism 12 serves as a table movement mechanism which moves and rotates the substrate supporting table 12d within a horizontal plane. The substrate supporting table 12d retains the substrate 2 on its upper surface.

Figure 4:
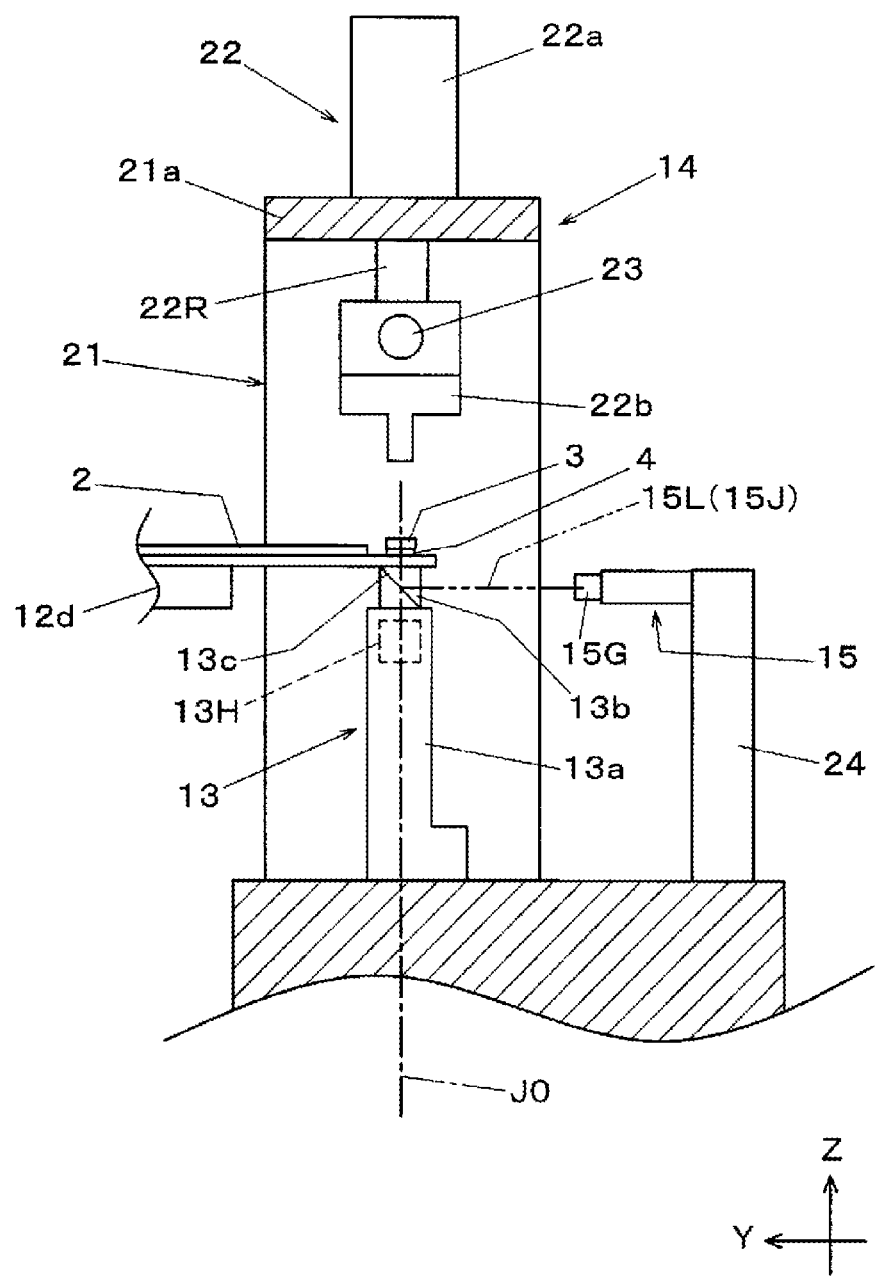
FIG. 4 is a partial enlarged side view of the component mounting apparatus according to the embodiment of the invention.

In FIG. 1 and FIG. 2, the receiving portion 13 is disposed in a region (region on the operator OP side) in front of the XYθ table mechanism 12. The receiving portion 13 includes a base member 13a and a transparent member 13b. The base member 13a is provided on the platform 11 and extends in the X-axis direction. The transparent member 13b is shaped like a square column and provided on an upper surface of the base member 13a, and extends in the X-axis direction. The transparent member 13b is made of a transparent material such as glass. A light reflection portion 13c is provided inside the transparent member 13b so that light incident on the light reflection portion 13c from the front can be reflected upwards by the light reflection portion 13c (FIG. 4). A heater (lower heater 13H) for heating the transparent member 13b is provided in an upper portion of the base member 13a.

In FIG. 1 and FIG. 2, the crimping operation portion 14 includes a portal frame 21 and a plurality of (four in this case) pressing portions 22. The portal frame 21 has a horizontal portion 21a which extends in the X-axis direction to cover the receiving portion 13 from above. The pressing portions 22 are provided in the horizontal portion 21a of the portal frame 21.

In FIG. 2 and FIG. 4, each pressing unit 22 includes a pressing cylinder 22a and a crimping tool 22b. The pressing cylinder 22a is attached to the horizontal portion 21a of the portal frame 21 to protrude a piston rod 22R downwards from the horizontal portion 21a. The crimping tool 22b is attached to a lower end of the piston rod 22R. Each pressing unit 22 is provided at a position where the crimping tool 22b is located above the transparent member 13b. A heater (upper heater 23) for heating the crimping tool 22b is provided in the crimping tool 22b of each pressing unit 22.

In FIG. 1 and FIG. 2, the light emission portions 15 are provided and arranged correspondingly to the four pressing portions 22 (i.e. in the same layout as the pressing portions 22). Here, each of the light emission portions 15 is constituted by a light emitter 15a. The light emitters 15a are provided in front of the receiving portion 13. The light emitters 15a are provided on a light emitter attachment member 24 which serves as another member physically separated from the base member 13a so that the light emitters 15a can be positioned distantly from the lower heater 13H mounted in the base member 13a provided on a lower side of a part on which pressing loads of the pressing portions 22 act.

Light source portions 15G of the light emitters 15a emit light beams 15L (which are ultraviolet rays in this case as one exemplary embodiment) horizontally backwards. Optical axes 15J of the light beams 15L emitted from the light source portions 15G of the light emitters 15a face the light reflection portion 13c inside the transparent member 13b from a direction (substantially horizontal direction) substantially perpendicular to an axis J0 of a direction (substantially up/down direction) in which the components 3 are pressed by the pressing portions 22. Therefore, the light beams 15L emitted from the light source portions 15G are reflected on the light reflection portion 13c inside the transparent member 13b to travel upwards. Then, the light beams 15L are transmitted through the transparent member 13b to reach the photo-curable resin 4 on the substrate 2 (FIG. 4). That is, the light emission portions 15 serve as emission portions which emit the light beams 15L to the photo-curable resin 4 through the transparent member 13b.

Figure 5:
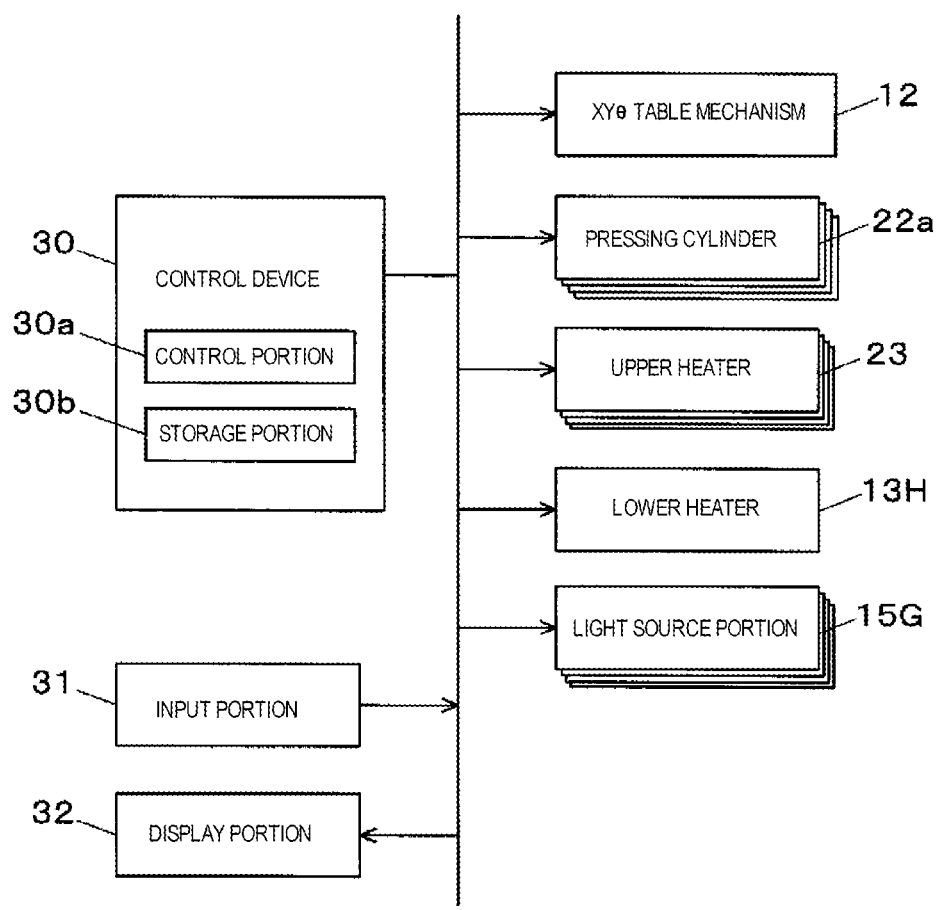
FIG. 5 is a block diagram showing a control system of the component mounting apparatus according to the embodiment of the invention.

In FIG. 5, the component mounting apparatus 1 further includes a control device 30, an input portion 31, and a display portion 32. The control device 30 has a control portion 30a and a storage portion 30b. The control portion 30a performs operation control on the XYθ table mechanism 12 to control the operation in which the substrate 2 retained by the substrate supporting table 12d is moved within the horizontal plane. In addition, the control portion 30a performs operation control on the pressing cylinders 22a through a not-shown pneumatic control circuit to control the operation in which the components 3 are pressed against the substrate 2 through the crimping tools 22b by the pressing portions 22 respectively. In addition, the control portion 30a performs operation control on the light emission portions 15 to thereby control emission of the light beams 15L from the light emission portions 15 respectively. Moreover, the control portion 30a performs operation control on the upper heaters 23 for heating the crimping tools 22b and operation control on the lower heater 13H for heating the transparent member 13b.

FIGS. 6A and 6B illustrate timings for the pressing operation and the light emission. In FIGS. 6A and 6B, the load applied to the component 3 by each of the pressing portions 22 and the intensity of the light beam 15L emitted to the photo-curable resin 4 by each of the light emission portions 15 are indicated respectively with their times (horizontal axes) being made consistent with each other. The control portion 30a controls the pressing portions 22 so that the pressing portions 22 press the components 3 against the substrate 2 (apply loads to the components 3) during a pressing time TP between the start of pressing of the components 3 (T2) to the end of pressing of the components 3 (T5).

In addition, the control portion 30a controls the light emission portions 15 that that the light emission portions 15 emit the light beams 15L to the photo-curable resin 4 during an emitting time TE between the start of emission of the light beams 15L (T3) and the end of emission of the light beams 15L (T4). In addition, the control portion 30a controls the pressing portions 22 and the light emission portions 15 so that emission of the light beams 15L is started (T3) a differential time TD earlier or later than the start of pressing of the components 3 (T2). Incidentally, in FIGS. 6A and 6B, emission of the light beams 15L is started (T3) the differential time TD later than the start of pressing of the components (T2).

In FIG. 5, the pressing time TP, the emitting time TE, the differential time TD, and a sequence (hereinafter referred to as "operation sequence") indicating which will be started earlier, either the pressing of the components 3 or the emission of the light beams 15L, can be inputted or changed by use of the input portion 31. The pressing time TP, the emitting time TE, the differential time TD and the operation sequence which have been inputted in the input portion 31 are stored in the storage portion 30b. The display portion 32 displays the pressing time TP, the emitting time TE, the differential time TD and the operation sequence which have been stored in the storage portion 30b.

Figure 7:
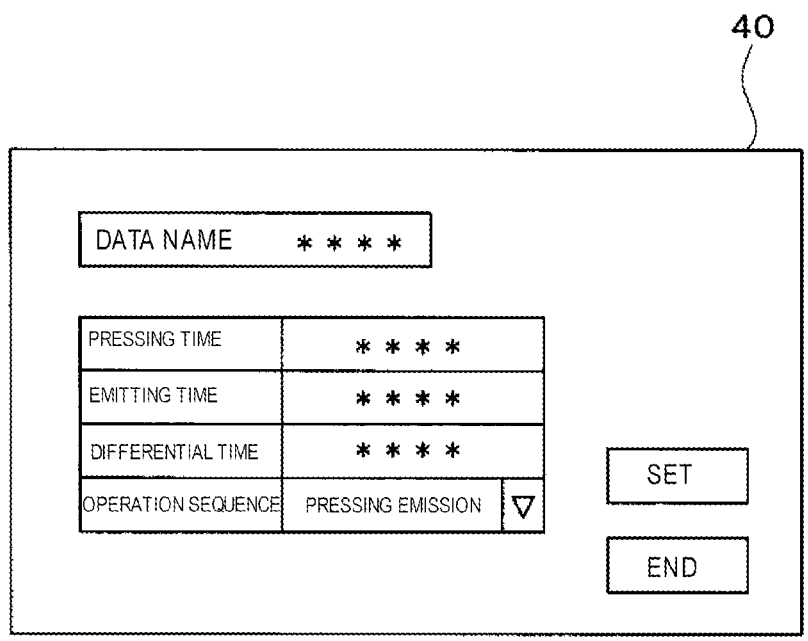
FIG. 7 is a view showing an example of display of a display portion of the component mounting apparatus according to the embodiment of the invention.

FIG. 7 illustrates an example of a table 40 of various data displayed by the display portion 32. Input fields for "data name", the "pressing time (TP)", the "emitting time (TE)", the "differential time (TD)" and the "operation sequence" are displayed in the table 40. The input portion 31 can be operated to input or change the "data name", the "pressing time (TP)", the "emitting time (TE)" and the "differential time (TD)". In addition, the input portion 31 can be operated so that either "pressing→emission" indicating that pressing of the components 3 will be started earlier or "emission→pressing" indicating that emission of the light beams 15L will be started earlier can be selected or changed in the input field for the "operation sequence". When the input portion 31 is operated to click "set", various data which have been inputted or changed are stored (set) in the storage portion 30b. In this manner, the various data displayed on the display portion 32 can be inputted while being confirmed. Accordingly, an input mistake can be prevented.

A procedure of a component mounting operation (component mounting method) performed by the component mounting apparatus 1 to crimp the components 3 to the substrate 2 will be described with reference to FIGS. 6A and 6B and FIGS. 8A and 8B. First, the control portion 30a performs operation control on the upper heaters 23 and the lower heater 13H to heat the crimping tools 22b of the pressing portions 22 and the transparent member 13b to predetermined temperatures respectively. The control portion 30a performs operation control on the XYθ table mechanism 12 to move the substrate supporting table 12d (arrow A indicated in FIG. 8A) so that, of the substrate 2 which has been placed on the substrate supporting table 12d, a lower surface on one side on which the components 3 have been placed (temporarily crimped) can be brought into contact with an upper surface of the transparent member 13b of the receiving portion 13 to thereby make the receiving portion 13 receive the substrate 2 from below (below receiving step).

That is, the control portion 30a controls the XYθ table mechanism 12 so that the lower surface of the substrate 2 on the one side on which the components 3 have been placed can be received from below by the receiving portion 13. In FIGS. 6A and 6B, the substrate 2 is received from below by the receiving portion 13 at a timing T1. Incidentally, in order to make the receiving operation more accurately, a load sensor (not shown) provided in the receiving portion 13 to measure a load applied to the substrate or an optical sensor (not shown) provided in one side of the receiving portion 13 to detect absence/presence of the substrate based on transmission or shielding of light may be used. When the load sensor or the optical sensor is provided, it is possible to accurately detect that the substrate 2 has been received from below by the receiving portion 13.

When the substrate 2 is received from below by the receiving portion 13, the control portion 30a protrudes the piston rods 22R of the pressing cylinders 22a of the pressing portions 22 downwards (arrow B indicated in FIG. 8B) to press the components 3 against the substrate 2 by the crimping tools 22b. That is, in FIGS. 6A and 6B, the control portion 30a starts pressing of the components 3 at the timing T2 which is later than the timing T1 by a delay time TH1 (pressing start step). The control portion 30a presses the components 3 during a pressing time TP1 which starts from the timing T2. When the components 3 are pressed, the photo-curable resin 4 is increased in temperature by the heated crimping tools 22b and the heated transparent member 13b and softened. Thus, the pressing portions 22 serve as pressing portions which press the components 3 against the substrate 2 which has been received from below by the receiving portion 13.

Figure 8A:
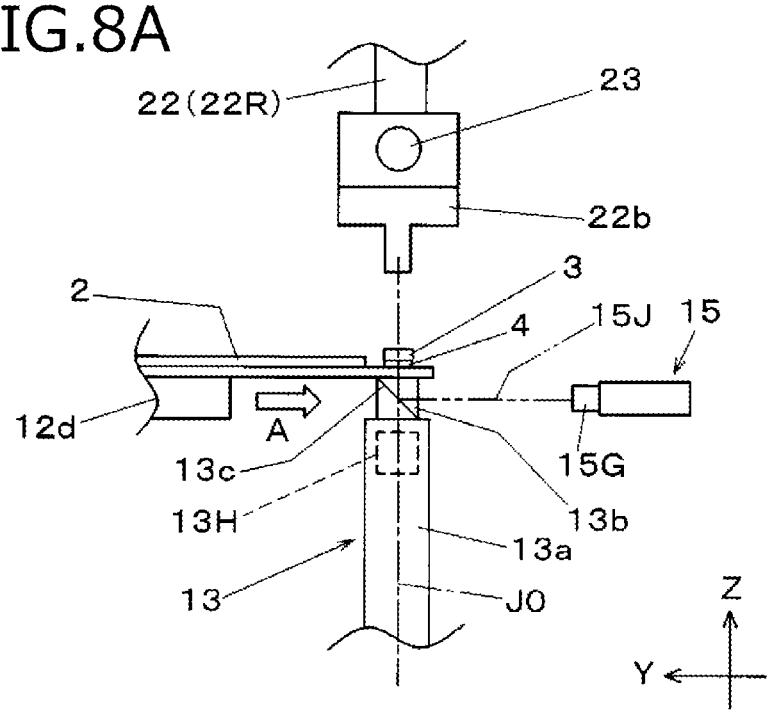
FIGS. 8A and 8B are views for explaining operation of the component mounting apparatus according to the embodiment of the invention.
Figure 8B:
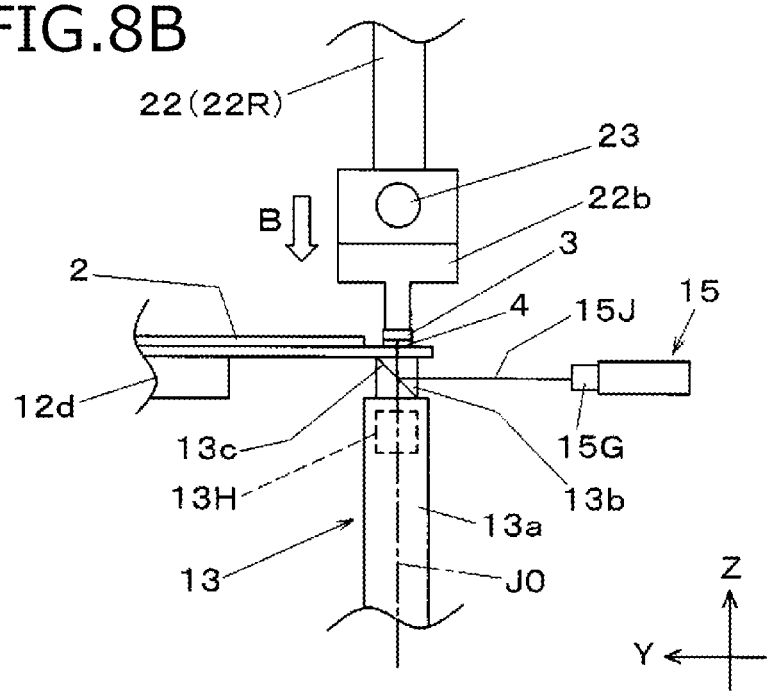

The control portion 30a starts emission of light beams (ultraviolet rays) 15L from the light emission portions 15 (FIG. 8B) when the components 3 are being pressed against the substrate 2 by the pressing portions 22 as described above. That is, in FIGS. 6A and 6B, the control portion 30a starts emission of the light beams 15L at the timing T3 which is the differential time TD later than the timing T2 (emission start step). The control portion 30a emits the light beams 15L during an emitting time TE1 which starts from the timing T3. In FIG. 8B, the light beams 15L emitted from the light emission portions 15 travel substantially horizontally and enter the transparent member 13b. The light beams 15L are reflected substantially vertically upwards by the light reflection portion 13c, and then transmitted upward through the transparent substrate 2 to reach the photo-curable resin 4. Thus, the photo-curable resin 4 is cured so that the components 3 can be fixed to the component placement positions 2a on the substrate 2.

In FIGS. 6A and 6B, the control portion 30a completes the emission of the light beams 15L at the timing T4 which is later than the timing T3 by the emitting time TE1 (emission complete step). Next, the control portion 30a pulls up the piston rods 22R to separate the crimping tools 22b from the components 3 to thereby complete the pressing of the components 3 at the timing T5 which is later than the timing T2 by the pressing time TP1 (pressing complete step).

When the operation for crimping the components 3 to the one side of the substrate 2 has been terminated as described above, the control portion 30a performs operation control on the XYθ table mechanism 12 to rotate the substrate 2 around the Z-axis so that another side of the substrate 2 on which the component placement positions 2a have been set can be received from below by the receiving portion 13. Then, a component mounting operation is performed in the same procedure.

Thus, in the aforementioned component mounting apparatus 1, when the substrate 2 is received from below by the receiving portion 13 (at the timing T1), the control portion 30a controls so as to start pressing of the components 3 a delay time TH1 later (at the timing T2) and then start emission of the light beams 15L the differential time TD later (at the timing T3). Thus, the photo-curable resin 4 can be cured by the light beams 15L after the photo-curable resin 4 is softened by heat and formed into shapes for fixing the components 3. Accordingly, it is possible to suppress mounting failure from occurring due to insufficient bonding strength or insufficient fixation strength.

Further, in the aforementioned component mounting apparatus 1, the input portion 31 can be used to input or change the pressing time TP, the emitting time TE, the differential time TD, and the operation sequence. The control portion 30a controls so as to press the components 3 during the pressing time TP when pressing of the components 3 has started and to emit the light beams 15L during the emitting time TE when emission of the light beams 15L has started. That is, the time between the start and the end of pressing of the components 3 and the time between the start and the end of emission of the light beams 15L can be set desirably and optimally. Accordingly, regardless of characteristics of the photo-curable resin 4 or a combination of the substrate 2 and the components 3 to be crimped, it is possible to suppress mounting failure from occurring due to insufficient bonding strength or insufficient fixation strength.

Next, another component mounting method performed by the aforementioned component mounting apparatus 1 will be described with reference to FIGS. 9A and 9B. The component mounting method (emission→pressing) shown in FIGS. 9A and 9B is different from the component mounting method (pressing→emission) shown in FIGS. 6A and 6B in the operation sequence. The control portion 30a controls so that a substrate 2 can be received from below by the receiving portion 13 at a timing T6 (below receiving step). Next, the control portion 30a controls so as to start emission of light beams 15L at a timing T7 which is later than the timing T6 by a delay time TH2 (emission start step). Next, the control portion 30a controls so as to start pressing of components 3 at a timing T8 which is later than the timing T7 by a differential time TD2 (pressing start step).

Next, the control portion 30a controls so as to complete the pressing of the components 3 at a timing T9 which is later than the timing T8 by a pressing time TP2 (pressing complete step). Next, the control portion 30a controls so as to complete the emission of the light beams 15L at a timing T10 which is later than the timing T7 by an emitting time TE2 (emission complete step). As described above, according to the timings in the embodiment, the emission of the light beams 15L starts the differential time TD2 earlier than the start of the pressing of the components 3. Thus, even a photo-softenable resin can be cured by heat after the resin is softened by the light beams 15L and formed into shapes for fixing the components 3. The photo-softenable resin is one kind of photo-modifiable resin, which can be softened when the resin is irradiated with light (ultraviolet rays). Accordingly, it is possible to suppress mounting failure from occurring due to insufficient bonding strength or insufficient fixation strength.

The invention has been described above based on one embodiment. It should be understood by those skilled in the art that various modifications can be made as to combination of the respective constituent elements or the processing process and these modifications are also included in the scope of the invention.

For example, the aforementioned embodiment has been described in the case where the input portion 31 can be operated to select or change the "operation sequence". However, it is not always necessary to select or change the "operation sequence". When, for example, only the photo-curable resin is allowed to be used as the photo-modifiable resin, the control portion may control so that the light beams can be emitted by the emission portions after pressing of the components 3 is started by the pressing portions 22. In addition, when, for example, only the photo-softenable resin is allowed to be used as the photo-modifiable resin, the control portion may control so that the components 3 can be pressed by the pressing portions 22 after emission of the light beams is started by the emission portions. Thus, even when the "operation sequence" is not allowed to be selected or changed, it is still possible to suppress mounting failure from occurring due to insufficient bonding strength or insufficient fixation strength.

It is possible to provide a component mounting apparatus which can suppress mounting failure from occurring due to insufficient bonding strength or insufficient fixation strength.

What is claimed is:

1. A component mounting apparatus for crimping a component to a transparent substrate on which the component is mounted through a photo-modifiable resin portion, the component mounting apparatus comprising:
    a receiving portion that comprises a transparent member and receives a surface of the substrate located under the component by an upper surface of the transparent member from below;
    a pressing portion that presses the component against the substrate received from below by the receiving portion;
    an emission portion that emits light to the photo-modifiable resin portion through the transparent member; and
    a control portion that controls a timing when the pressing portion starts pressing of the component and a timing when the emission portion starts emission of the light;
    wherein the control portion controls the pressing portion and the emission portion so as to start the emission of the light a predetermined differential time earlier or later than the start of the pressing of the component in a state that the substrate is received from below by the receiving portion.

2. The component mounting apparatus according to claim 1, further comprising:
    an input portion,
    wherein a pressing time during which the component is pressed against the substrate, an emitting time during which light is emitted to the photo-modifiable resin, the differential time, and a sequence indicating which is started earlier, either the pressing of the component or the emission of the light, are inputted in the input portion; and
    wherein the control portion controls the pressing portion and the emission portion so as to press the component during the pressing time when the pressing of the component has started, and to emit the light during the emitting time when the emission of the light has started.

3. The component mounting apparatus according to claim 2, wherein the pressing time, the emitting time, the differential time, and the sequence indicating which is started earlier, either the pressing of the component or the emission of the light, are changed in the input portion.

4. The component mounting apparatus according to claim 2, further comprising:
a display portion,
wherein the display portion displays the pressing time, the emitting time, and the differential time.

5. The component mounting apparatus according to claim 1, further comprising:
a substrate supporting table that supports the substrate; and
a table movement mechanism that moves the substrate supporting table,
wherein the control portion controls the table movement mechanism so that a surface of the substrate on one side on which the component is mounted is received from below by the receiving portion.

\* \* \* \* \*